United States Patent
Wiatr et al.

(10) Patent No.: US 8,097,519 B2
(45) Date of Patent: Jan. 17, 2012

(54) SOI DEVICE HAVING A SUBSTRATE DIODE FORMED BY REDUCED IMPLANTATION ENERGY

(75) Inventors: Maciej Wiatr, Dresden (DE); Markus Forsberg, Dresden (DE); Roman Boschke, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 261 days.

(21) Appl. No.: 12/113,271

(22) Filed: May 1, 2008

(65) Prior Publication Data

US 2009/0111223 A1   Apr. 30, 2009

(30) Foreign Application Priority Data

Oct. 31, 2007   (DE) .......................... 10 2007 052 097

(51) Int. Cl.
*H01L 21/331* (2006.01)
*H01L 21/8222* (2006.01)

(52) U.S. Cl. ................................ 438/311; 257/E21.564

(58) Field of Classification Search .................. 438/197, 438/237, 311, 328
See application file for complete search history.

(56) References Cited

U.S. PATENT DOCUMENTS

| 5,358,881 A * | 10/1994 | Packwood ................... 438/526 |
| 5,430,318 A | 7/1995 | Hsu ............................... 257/370 |
| 5,770,875 A * | 6/1998 | Assaderaghi et al. ........ 257/301 |
| 2002/0022328 A1* | 2/2002 | Ang et al. ..................... 438/303 |
| 2006/0105508 A1 | 5/2006 | Zia et al. ....................... 438/152 |
| 2006/0258110 A1* | 11/2006 | Pelella .......................... 438/311 |
| 2007/0249166 A1 | 10/2007 | Pelella .......................... 438/689 |
| 2008/0303090 A1* | 12/2008 | Ieong et al. ................... 257/351 |

OTHER PUBLICATIONS

Translation of Official Communication from German Patent Office for German Patent Application No. 10 2007 052 097.4-33 dated Jul. 4, 2008.

* cited by examiner

*Primary Examiner* — Charles Garber
*Assistant Examiner* — Calvin Choi
(74) *Attorney, Agent, or Firm* — Williams, Morgan & Amerson, P.C.

(57) ABSTRACT

By removing material during the formation of trench openings of isolation structures in an SOI device, the subsequent implantation process for defining the well region for a substrate diode may be performed on the basis of moderately low implantation energies, thereby increasing process uniformity and significantly reducing cycle time of the implantation process. Thus, enhanced reliability and stability of the substrate diode may be accomplished while also providing a high degree of compatibility with conventional manufacturing techniques.

13 Claims, 7 Drawing Sheets

SOI DEVICE HAVING A SUBSTRATE DIODE FORMED BY REDUCED IMPLANTATION ENERGY

BACKGROUND OF THE INVENTION

1. Field of the Invention

Generally, the present disclosure relates to the formation of integrated circuits, and, more particularly, to substrate diodes of complex SOI circuits, which may be used for thermal sensing application and the like.

2. Description of the Related Art

The fabrication of integrated circuits requires a large number of circuit elements, such as transistors and the like, to be formed on a given chip area according to a specified circuit layout. Generally, a plurality of process technologies are currently practiced, wherein, for complex circuitry, such as microprocessors, storage chips, ASICs (application specific ICs) and the like, CMOS technology is currently one of the most promising approaches due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region, upon formation of a conductive channel due to the application of an appropriate control voltage to the gate electrode, depends on the dopant concentration, the mobility of the majority charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the latter aspect renders the reduction of the channel length, and associated therewith the reduction of the channel resistivity, a dominant design criterion for accomplishing an increase in the operating speed of the integrated circuits.

In view of the former aspect, in addition to other advantages, the SOI (semiconductor or silicon on insulator) architecture has continuously been gaining in importance for manufacturing MOS transistors due to their characteristics of a reduced parasitic capacitance of the PN junctions, thereby allowing higher switching speeds compared to bulk transistors. In SOI transistors, the semiconductor region, in which the drain and source regions as well as the channel region are located, also referred to as the body, is dielectrically encapsulated. This configuration provides significant advantages, but also gives rise to a plurality of issues. Contrary to the body of bulk devices, which is electrically connected to the substrate and thus applying a specified potential to the substrate maintains the bodies of bulk transistors at a specified potential, the body of SOI transistors is not connected to a specified reference potential, and, hence, the body's potential may usually float due to accumulating minority charge carriers, unless appropriate countermeasures are taken.

A further issue in high performance devices, such as microprocessors and the like, is an efficient device-internal temperature management due to the significant heat generation. Due to the reduced heat dissipation capability of SOI devices caused by the buried insulating layer, the corresponding sensing of the momentary temperature in SOI devices is of particular importance.

Typically, for thermal sensing applications, an appropriate diode structure may be used wherein the corresponding characteristic of the diode may permit information to be obtained on the thermal conditions in the vicinity of the diode structure. The sensitivity and the accuracy of the respective measurement data obtained on the basis of the diode structure may significantly depend on the diode characteristic, i.e., on the diode's current/voltage characteristic, which may depend on temperature and other parameters. For thermal sensing applications, it may therefore typically be desirable to provide a substantially "ideal" diode characteristic in order to provide the potential for precisely estimating the temperature conditions within the semiconductor device. In SOI devices, a corresponding diode structure, i.e., the respective PN junction, is typically formed in the substrate material located below the buried insulating layer, above which is formed the "active" semiconductor layer used for forming therein the transistor elements. Thus, at least some additional process steps may be required, for instance, for etching through the semiconductor layer or a corresponding trench isolation area and through the buried insulating layer in order to expose the crystalline substrate material. On the other hand, the process flow for forming the substrate diode is typically designed to exhibit a high degree of compatibility with the process sequence for forming the actual circuit elements, such as the transistor structures, without undue negative effects on the actual circuit elements.

However, during the process flow for manufacturing the substrate diode, a plurality of process steps have to be performed that are specifically designed for the substrate diode, wherein one of these process steps includes a high energy implantation process for defining a well region for the substrate diode, which may result in a reduced ideality of diode characteristics, as will be described in more detail with reference to FIGS. 1a-1c.

FIG. 1a schematically illustrates a cross-sectional view of a semiconductor device 100 representing an SOI device. The device 100 comprises a substrate 101 which includes, at least in an upper portion thereof, a substantially crystalline substrate material which may be referred to as substrate semiconductor layer 102, which may represent the pre-doped material according to standard SOI substrates. For instance, the substrate semiconductor layer 102 may have incorporated therein a moderately low concentration of a P-type dopant. Furthermore, the semiconductor device 100 comprises a buried insulating layer 104, for instance, comprised of silicon dioxide and the like, which separates a semiconductor layer 105, such as a silicon layer, from the substrate semiconductor layer 102. The semiconductor layer 105 may be comprised of a substantially crystalline semiconductor material, such as silicon, silicon/germanium or any other appropriate silicon-based material for forming therein and thereon a plurality of circuit elements, such as transistors and the like. For this reason, the semiconductor layer 105 may also be referred to as an "active" semiconductor layer. Moreover, the semiconductor device 100 may comprise a first device region 110, dedicated to receiving a substrate diode in a later manufacturing stage, and a second device region 120, which comprises a plurality of trench isolation structures 121. The isolation structures 121 may be comprised of any appropriate material, such as silicon dioxide and the like.

A typical process flow for forming the semiconductor device 100 as shown in FIG. 1a may comprise the following processes. After providing the substrate 101 having formed thereon the buried insulating layer 104 and the active semiconductor layer 105, the device 100 may be prepared for a subsequent etch process for forming respective trench openings for the trench isolation structures 121. For this purpose, a hard mask layer, also used as a chemical mechanical polishing (CMP) stop layer (not shown), may be formed, for instance, in combination with an etch stop liner (not shown), above which an appropriate etch mask may be created on the basis of sophisticated lithography techniques. Thereafter, the trench openings may be etched to extend to the buried insulating layer 104 followed by an appropriate re-filling of the trench openings, for instance, on the basis of well-established oxidation and deposition techniques. Thereafter, any excess material may be removed by chemical mechanical polishing using the stop layer for controlling the process and subsequently removing residues of the CMP stop layer using the etch stop layer, which may then also be removed, if desired.

FIG. 1b schematically illustrates the semiconductor device 100 during an implantation process 130, which is performed on the basis of an implantation mask 131 covering the second device region 120 and exposing at least a portion of the first device region 110. The implantation process 130 is designed such that an appropriate species, such as an N-type species, is introduced into the substrate semiconductor layer 102 in order to define a well region 111 for a substrate diode to be formed in a later manufacturing sequence. For this purpose, the process parameters of the implantation process 130 have to be selected such that the dopant ions pass through the active layer 105, the buried insulating layer 104 and into the substrate semiconductor layer 102 according to a specified distribution and depth. Hence, a moderately high degree of variability may occur during the implantation process 130, thereby creating a respective variability of the diode characteristics, which may thus translate into a reduced reliability in detecting the thermal conditions in the substrate 101. Furthermore, since moderately high implantation energies are required, a double-ionized dopant species may have to be used, thereby resulting in significantly reduced implantation currents, thus contributing to increased process times for the process 130. Consequently, the throughput of respective implantation tools is significantly reduced.

FIG. 1c schematically illustrates the semiconductor device 100 in a further advanced manufacturing stage. As shown, the second device region 120 comprises a plurality of schematically depicted gate electrode structures 122, while also in this stage drain and source extension regions 123 may have been formed. Furthermore, an etch mask 132 is provided which covers the second device region 120 while exposing the first device region 110 to an etch ambient 133. The etch ambient 133 is configured to etch through the active semiconductor layer 105 and the buried insulating layer 104 in order to expose the well region 111, thereby forming respective substrate openings 112A, 112B. During the moderately complex etch process 133, which requires different etch chemistries for etching through the layer 105 and the buried insulating layer 104, the exposure of the well region 111 and thus attack and removal of material thereof may also affect the diode characteristics, so that, in combination with the preceding high energy implantation process 130 of the overall device, stability of the substrate diode still to be formed may be deteriorated.

After exposure of the well region 111 by means of the substrate openings 112A, 112B, the further processing may be continued by completing respective transistor structures on the basis of the gate electrodes 122, while, in the same process sequence, the highly doped areas for the substrate diodes may also be formed. That is, when forming respective N-type drain and source regions, one of the openings 112A, 112B may be masked while the other one may also receive a respective high dopant concentration. Similarly, when P-type drain and source regions are formed in the second device region, the other one of the openings 112A, 112B is masked. Thus, a respective contact area and a diode PN junction may be provided, which may then be contacted during a common manufacturing sequence, in which contacts are also formed to the transistor structures in the second device region.

Thus, as previously explained, reduced uniformity and thus decreased diode ideality may result from the process sequence described above, wherein a reduced overall throughput may also be caused due to the high energy implantation process.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to methods for forming a substrate diode in an SOI device with a high degree of compatibility to conventional process regimes, while nevertheless providing enhanced throughput and increased diode stability. For this purpose, the implantation process for forming a well region for the substrate diode may be performed on the basis of less critical implantation parameters in order to reduce implantation-induced fluctuations and also increase the overall process throughput. This may be accomplished by removing material of the device region that receives the well region of the substrate diode prior to performing the implantation process, thereby enabling the usage of reduced implantation energies that may be achieved on the basis of single-ionized ion species. In some illustrative aspects, the material removal prior to the implantation process for the diode well may be performed concurrently with the formation of respective trench openings for trench isolation structures. Thus, process fluctuations caused by high energy implantation processes may be reduced while also increasing the overall process throughput.

One illustrative method disclosed herein comprises forming a first opening in a first device region and a plurality of trench openings in a second device region of an active semiconductor layer that is formed above a buried insulating layer and a substrate semiconductor layer of an SOI substrate, wherein the first opening and the trench openings extend to the buried insulating layer. The method further comprises selectively implanting a dopant species into the substrate semiconductor layer through the first opening and filling the first opening and the plurality of trench openings so as to form trench isolation structures in the second device region. Furthermore, gate electrode structures are formed in the second device region and a first portion and a second portion of the substrate semiconductor layer are exposed in the first device region. Finally, drain and source regions are formed in the active semiconductor layer and a diode structure is formed in the exposed first and second portions of the substrate semiconductor layer.

A further illustrative method disclosed herein comprises forming a substrate opening in a first device region and a plurality of trench openings in a second device region of an active semiconductor layer that is formed on an SOI substrate, wherein at least the first opening substantially extends to a substrate semiconductor layer of the SOI substrate. The method additionally comprises implanting a dopant species through the first opening and filling the substrate opening and the trench openings. Finally, the method comprises forming a plurality of transistors in the second device region and a substrate diode in the first device region.

Another illustrative method disclosed herein relates to forming a substrate diode, wherein the method comprises forming a first opening for a substrate diode, wherein the first opening extends at least to a buried insulating layer separating a substrate semiconductor layer from an active semiconductor layer of an SOI device. The method further comprises implanting an ion species through the first opening into the substrate semiconductor layer. Additionally, trench openings formed in the active semiconductor layer and extending at least to the buried insulating layer are filled to form trench isolation structures after implanting the ion species. Finally, the method comprises forming a transistor in an active region bordered by the trench isolation structures and also forming a substrate diode in a well region defined by the dopant species.

BRIEF DESCRIPTION OF THE DRAWINGS

The disclosure may be understood by reference to the following description taken in conjunction with the accompanying drawings, in which like reference numerals identify like elements, and in which.

Figure 1A:
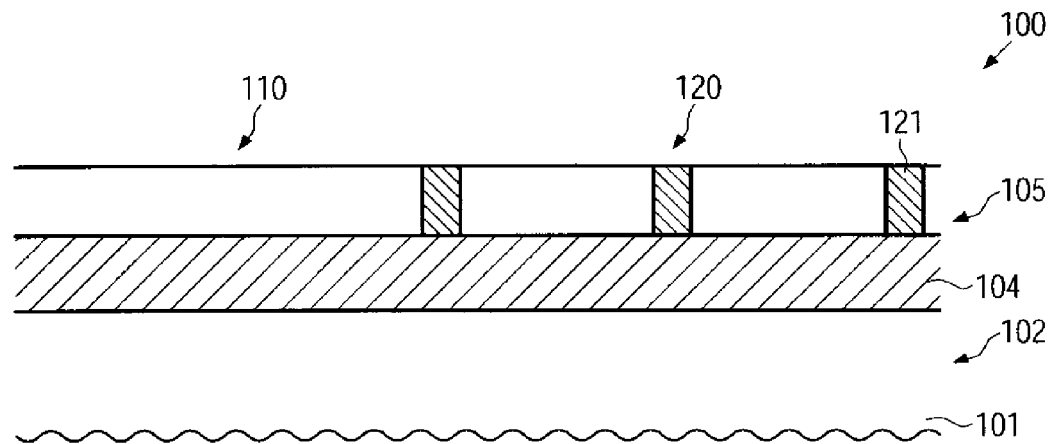
FIGS. 1a-1c schematically illustrate cross-sectional views of a semiconductor device during various manufacturing stages in forming a substrate diode for an SOI device on the basis of a high energy implantation process according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein relates to enhanced manufacturing techniques for forming substrate diodes of an SOI device, wherein high implantation energies during the definition of a well region of the substrate diode may be avoided. For this purpose, at least the material of the active semiconductor layer may be removed prior to implanting the dopant species for the well region, thereby significantly relaxing implantation-induced process variability while also increasing implantation tool throughput, since single-ionized dopant species may be used. In some illustrative aspects, the material removal is performed commonly with the creation of respective trench openings for trench isolation structures, thereby providing a highly efficient process flow while nevertheless preserving compatibility with well-established process strategies, in particular, during the definition of the highly doped PN junction of the substrate diode. Consequently, enhanced diode stability and reduced process time may be accomplished without requiring significant modifications of the overall process flow. In other illustrative aspects disclosed herein, the opening for the well region of the substrate diode may be formed to extend a significant length into the buried insulating layer or down to the substrate semiconductor material, thereby further enhancing the efficiency of the corresponding implantation process. In this case, in some embodiments, the well implantation of transistor elements may be performed concurrently with the well implantation for the substrate diode, thereby further enhancing the overall process uniformity.

Figure 2A:
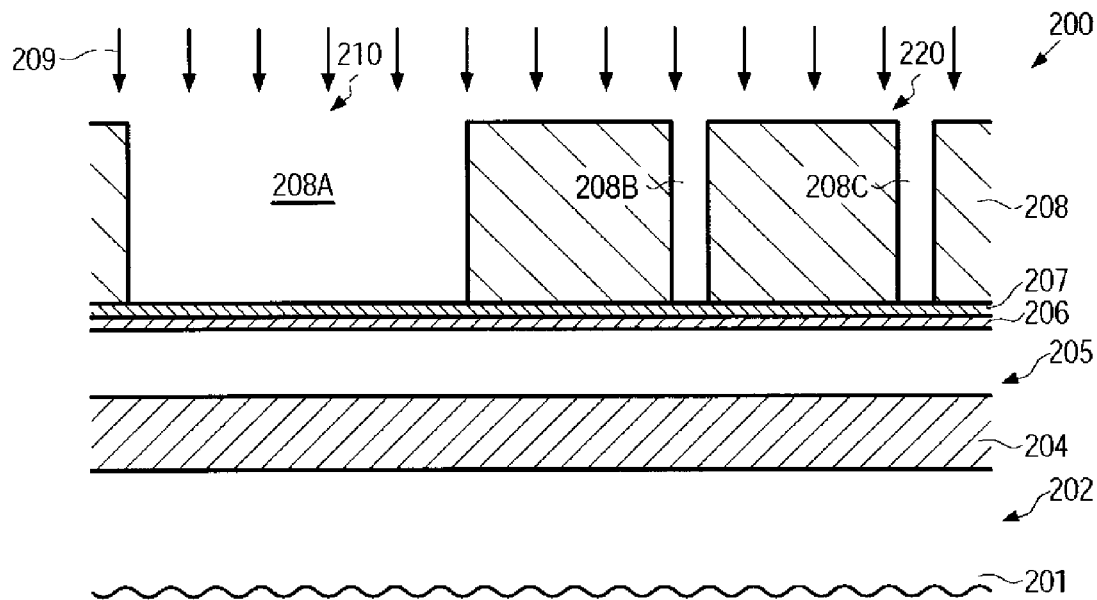
FIGS. 2a-2g schematically illustrate cross-sectional views of a semiconductor device during various manufacturing stages in forming a substrate diode of an SOI device on the basis of an implantation process for defining a well region using low implantation energies according to illustrative embodiments.

FIG. 2a schematically illustrates a semiconductor device 200 in the form of an SOI device, which may comprise a substrate 201 having formed thereon a semiconductor layer 202, which may represent a substantially crystalline semiconductor material, such as silicon and the like. As previously explained with reference to the device 100, the semiconductor layer 202 may also represent an upper portion of the substrate 201, when provided in the form of a substantially crystalline semiconductor material. Thus, the layer 202 may also be referred to as a substrate semiconductor layer, which may be appropriately configured so as to form therein a PN junction for a substrate diode. Furthermore, the device 200 may comprise a buried insulating layer 204, which may be comprised of silicon dioxide and the like. A semiconductor layer 205, which may represent any appropriate semiconductor material for forming therein drain and source regions of transistors, may be provided on the buried insulating layer 204 with an appropriate thickness according to the device requirements of the device 200. It should be appreciated that the SOI configuration defined by the substrate semiconductor layer 202, the buried insulating layer 204 and the active semiconductor layer 205 may not necessarily extend across the entire substrate 201 but may be restricted to certain device areas, depending on the overall configuration of the semiconductor device 200. Furthermore, in the manufacturing stage shown, the semiconductor device 200 may comprise an appropriate sacrificial layer, for instance in the form of an etch stop layer 206, which may be comprised of silicon dioxide, and a hard mask layer or CMP control or stop layer 207, which may be comprised of silicon nitride and the like. Furthermore, an etch mask 208 may be provided and may have an opening 208A in a first device region 210 and openings 208B, 208C in a second device region 220. The opening 208A may define a portion of the first device region 210, which may correspond to a well region to be defined in the substrate semiconductor layer 202 on the basis of an ion implantation process. The openings 208B, 208C in the second device region 220 on the other hand may represent respective trench openings for a trench isolation structure for delineating active regions of respective transistor elements or any other circuit elements.

The semiconductor device 200 as shown in FIG. 2a may be formed on the basis of the following processes. After providing the substrate 201 including the layers 202, 204 and 205, the sacrificial layers 206 and 207 may be formed, for instance, on the basis of oxidation and deposition techniques using well-established recipes. Thereafter, an appropriate lithography mask may be used which, in addition to defining the respective trench openings 208B, 208C, may also be configured to define the opening 208A for the well region of the substrate diode still to be formed. Based on well-established lithography recipes, the mask 208 may be formed, which may, for instance, comprise a resist mask, possibly in combination with appropriate anti-reflective coating (ARC) materials and the like. Thereafter, an etch process 209 may be performed, for instance, for etching through one or both of the layers 207, 206, which may then be used as a hard mask for the further etching through the active semiconductor layer 205. It should be appreciated that the etch process 209 may be performed on the basis of well-established recipes as are also used for defining trench openings for conventional trench isolation structures. A different etch rate in the first and second device regions 210, 220, for instance, due to a difference in the lateral dimensions of the opening 208A compared to smaller openings 208B, 208C, may not be critical, since erosion of the buried insulating layer 204 in the first device region 210 may even be considered advantageous, as will be described later on.

Figure 2B:
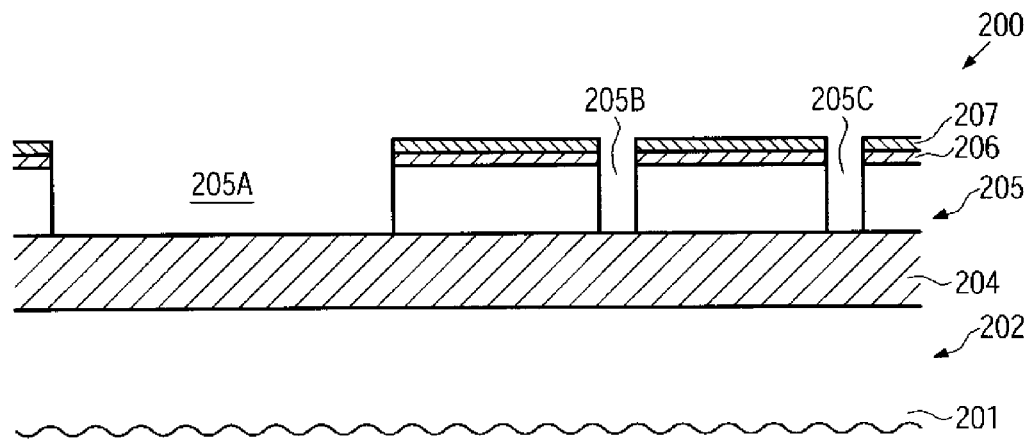

FIG. 2b schematically illustrates the semiconductor device 200 after finishing the etch process 209 and removing the mask 208, if provided during the etch process 209. Thus, in one illustrative embodiment, the device 200 may comprise an opening 205A corresponding to a well region still to be formed in the substrate semiconductor layer 202 and may also comprise openings 205B, 205C representing trench openings for the isolation structures still to be formed.

Figure 1B:
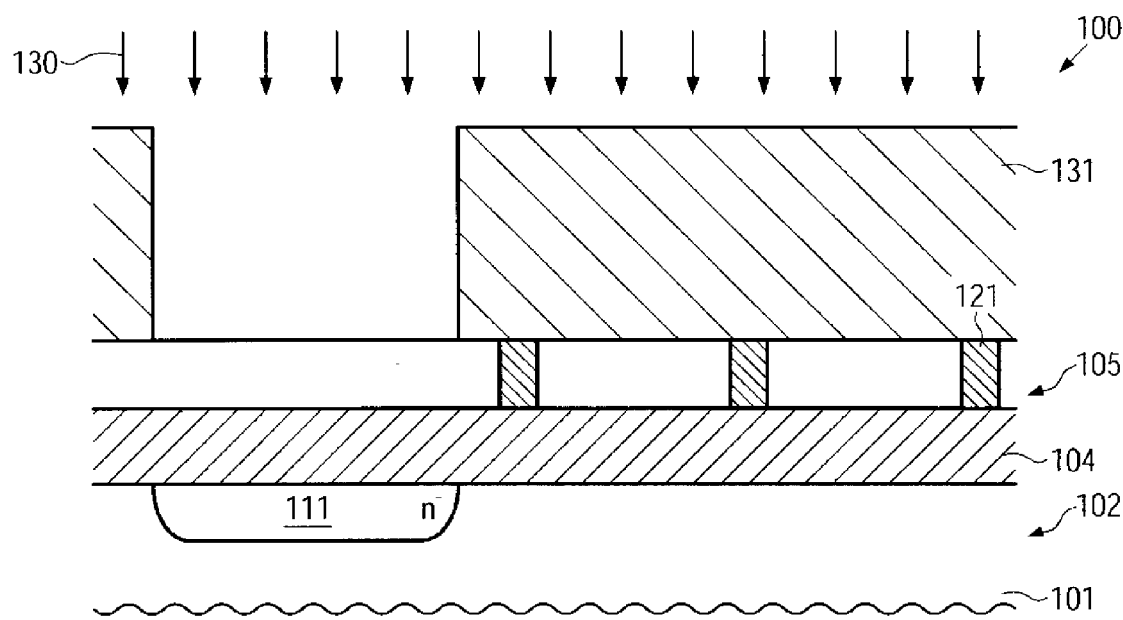
Figure 2C:
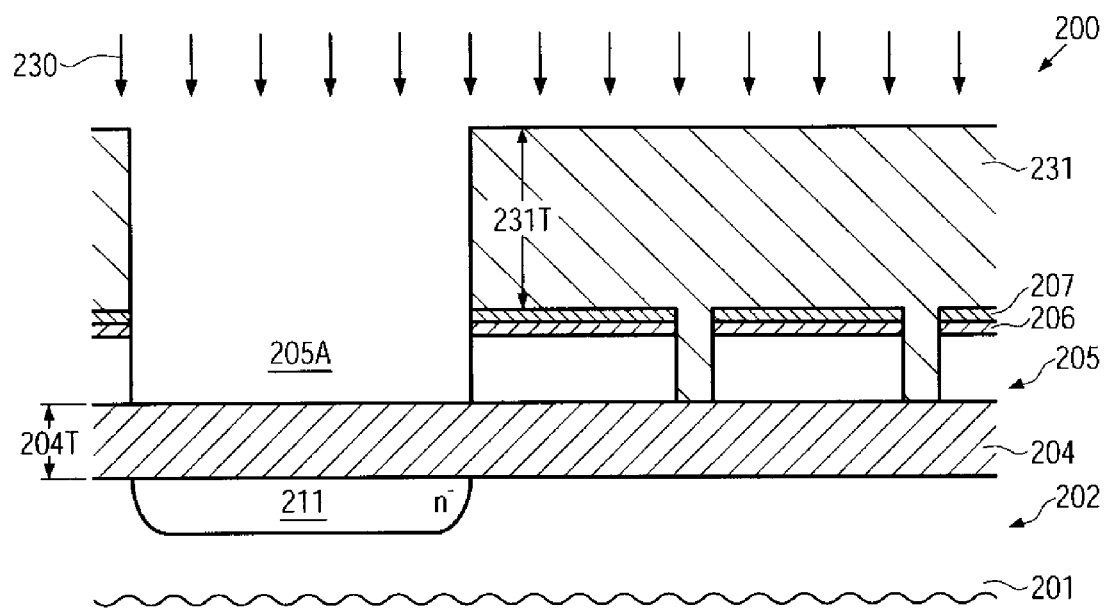

FIG. 2c schematically illustrates the semiconductor device 200 having formed thereon an implantation mask 231, which is configured to cover the second device region 220 while exposing at least a portion of the first device region 210, wherein, in the embodiment shown, the mask 231 may expose the opening 205A. Based on the implantation mask 231, an implantation process 230 may be performed in order to create a well region 211 in the substrate semiconductor layer 202. During the implantation process 230, the respective parameters, such as implantation energy and dose, may be selected with respect to a thickness 204T of the buried insulating layer and a desired vertical extension of the well region 211. Contrary to conventional strategies, a significantly reduced overall penetration depth is required during the implantation process 230, thereby enabling a process on the basis of a single-ionized implantation species, such as dopant species typically used when well regions for transistors and other circuit elements are to be formed. In the embodiment shown, an N-well region 211 is to be formed, while, in other cases, a P-type dopant may be introduced when a P-well is required for the substrate diode still to be formed. For instance, arsenic ions or phosphorous ions may be used on the basis of well-established implantation recipes, wherein the reduced thickness 204T provides enhanced process uniformity during the process 230. Furthermore, a required thickness 231T of the implantation mask 231 may be significantly reduced compared to a thickness of the mask 131 (FIG. 1b), since a significantly lower implantation energy may be used during the process 230. Thus, the uniformity of the respective lithography process for forming the implantation mask 231 may also be enhanced, thereby further increasing the overall process uniformity, for instance, with respect to defining the lateral position and lateral size of the trench openings 205B, 205C.

After the implantation process 230, the mask 231 may be removed on the basis of well-established plasma assisted or wet chemical etch recipes, in order to prepare the device 200 for the filling of the trench openings 205B, 205C on the basis of well-established recipes.

Figure 2D:
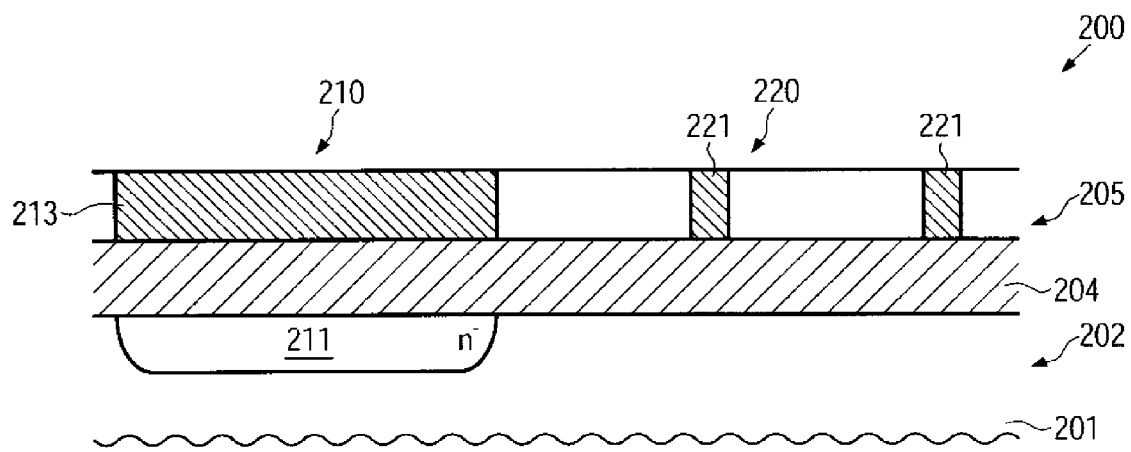

FIG. 2d schematically illustrates the semiconductor device 200 in a further advanced manufacturing stage. As shown, the device 200 may comprise trench isolations 221 in the second device region 220, while an "isolation structure" of increased lateral dimension and corresponding to the dimension of the well region 211 may be formed in the first device region 210. The trench isolation structures 221 and the structure 213 may be formed by oxidation and/or deposition techniques, as previously described, wherein any excess material may be removed on the basis of, for instance, planarization techniques including CMP, etching and the like, while residues of the layer 207 may be removed on the basis of the etch stop layer 206, which in turn may also be removed on the basis of well-established wet chemical etch recipes.

Figure 1C:
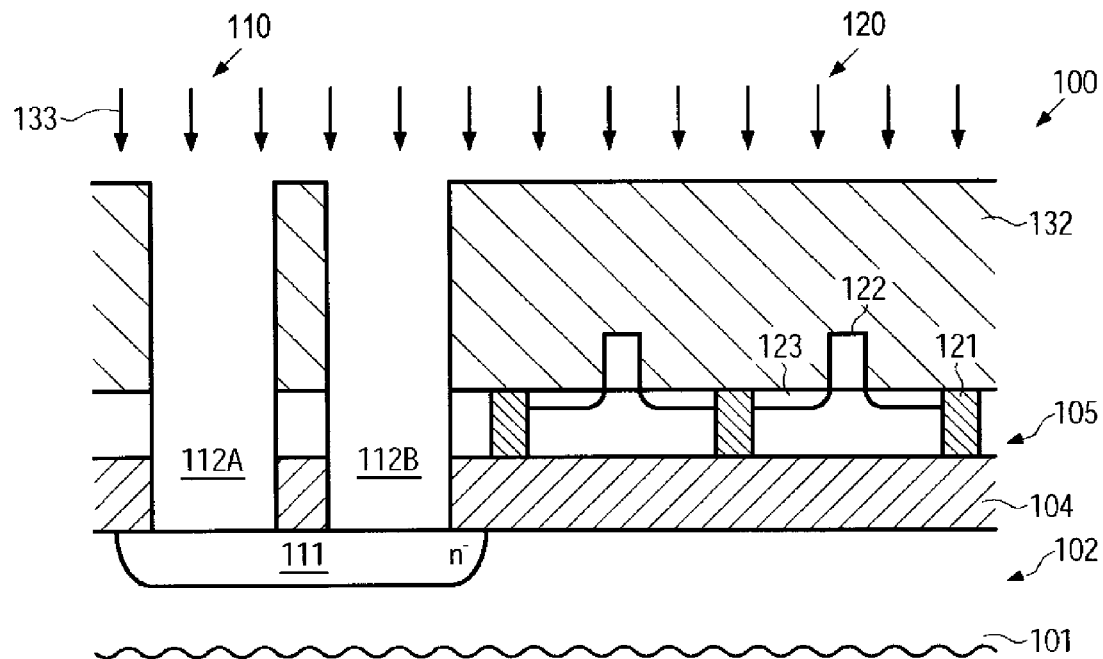
Figure 2E:
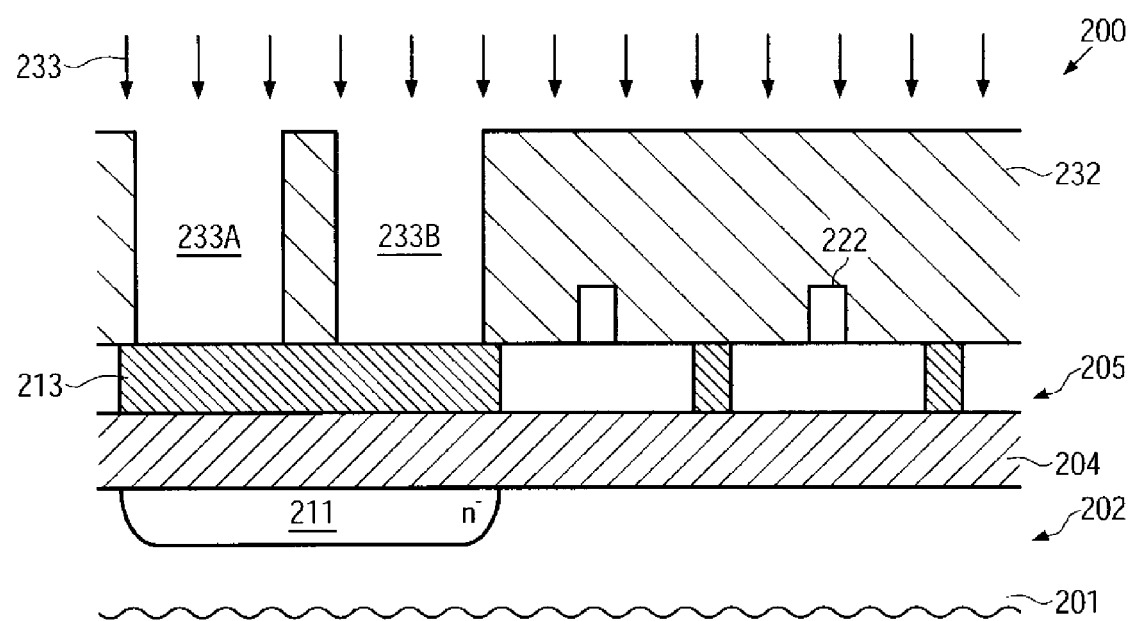

FIG. 2e schematically illustrates the semiconductor device 200 with schematically depicted gate electrode structures 222 formed in the second device region 220, when a high degree of compatibility with conventional strategies is desired. Furthermore, the device is subjected to an etch process 233 that is performed on the basis of an etch mask 232. It should be appreciated that, depending on the desired diode PN junction still to be formed in the well region 211, respective implantation processes for forming shallow drain and source extension regions adjacent to the gate electrode structures 222 may have not been performed or may have already been performed, as is, for instance, described with reference to the semiconductor device 100 (FIG. 1c). The etch mask 232 may have openings 233A, 233B positioned and sized so as to define substrate openings in the structure 213 and the buried insulating layer 204 in order to obtain highly doped regions in the well region 211, as previously explained. The structure 213 may be comprised of substantially the same material as the buried insulating layer 204 when silicon dioxide is used as the fill material of the trench isolations 221 and for forming the buried insulating layer 204. In this case, any selective anisotropic etch chemistry may be used during the etch process 233 in order to control the advance of the etch front when etching through the structure 213 and the buried insulating layer 204. In other illustrative embodiments (not shown), an etch stop layer may be incorporated into the structure 213 and thus also into the trench isolations 221 positioned on sidewalls and the bottom of the structures 213 and 221, for instance, in the form of a thin silicon nitride layer, thereby enhancing the overall uniformity of the process 233, that is, in this case, it may be etched through the structure 213 and the corresponding etch step may be reliably stopped by the etch stop layer, which may then be opened on the basis of a different etch chemistry followed by a process for etching through the buried insulating layer 204, which may be accomplished by an etch chemistry having a high etch selectivity with respect to the material of the layer 202. It should be appreciated that, irrespective of whether an additional etch stop layer may be provided, the overall process uniformity of the etch process 233 may be enhanced compared to the process 133, which may require the etching of the silicon-based material of the active layer 105 followed by the etching of the buried insulating layer 104. Consequently, the overall process uniformity during the definition of the well region 211 and the exposure of portions thereof may be enhanced while additionally the overall process time may be significantly reduced due to the enhanced implantation parameters.

Figure 2F:
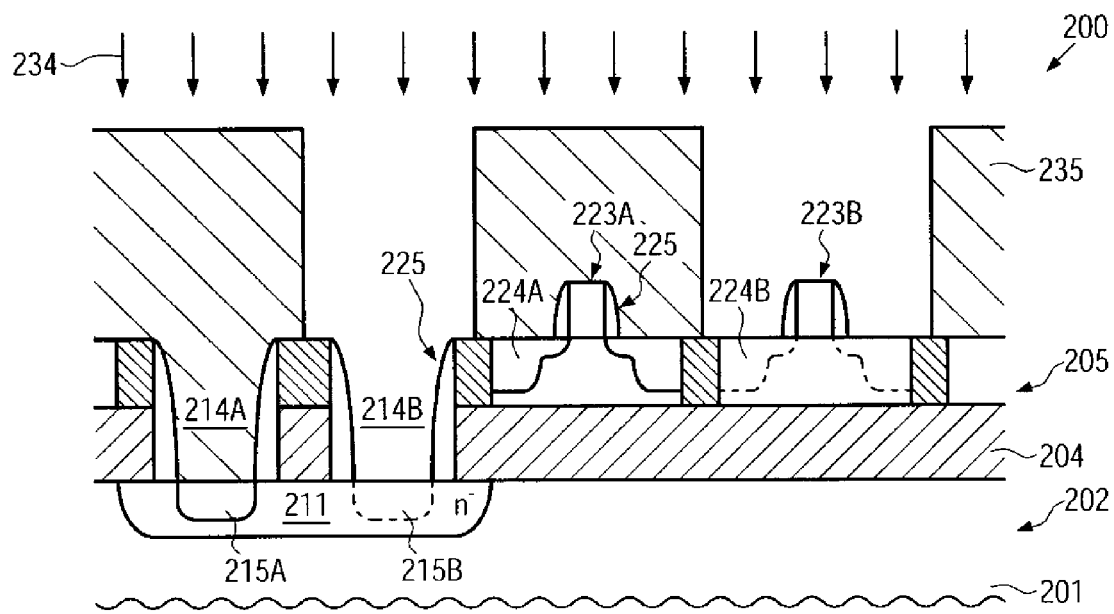

FIG. 2f schematically illustrates the semiconductor device 200 in a further advanced manufacturing stage. As illustrated, transistor elements 223A, 223B may be formed in the second device region 220, wherein, for instance, the transistor 223A may represent an N-channel transistor while the transistor 223B may represent a P-channel transistor. In this stage, the transistor 223A may comprise drain and source regions 224A, while the transistor 223B is to receive respective drain and source regions 224B on the basis of an ion implantation process 234, which is performed by using an implantation mask 235 which exposes the transistor 223B while covering the transistor 223A. Moreover, the implantation mask 235 may cover a substrate opening 214A connecting to a highly doped region 215A within the well region 211, wherein the highly doped region 215A may have substantially the same dopant concentration as the drain and source regions 224A. Similarly, the mask 235 may expose a further substrate opening 214B connecting to the well region 211 so as to define therein a highly doped region 215B corresponding to the drain and source regions 224B.

The semiconductor device 200 as illustrated in FIG. 2f may be formed on the basis of manufacturing techniques, which may also be used in conventional strategies, when a high degree of process compatibility is desired. That is, after forming the openings 214A, 214B on the basis of the etch process 233, manufacturing processes may be carried out in order to complete the transistors 223A, 223B, for instance, by forming the drain and source regions 224A while concurrently forming the highly doped region 215A. The corresponding manufacturing sequence may also include the formation of appropriate spacer elements 225, which may also be formed within the openings 214A, 214B. As previously explained, depending on the complexity of the dopant profiles in the drain and source regions 224A, 224B, the spacer structure 225 may be provided with a plurality of individual spacer elements, which may be subsequently formed with intermediate implantation steps. As discussed above, in some illustrative embodiments, the highly doped regions 215A, 215B may not necessarily have experienced all of the implantation processes as may be used for the drain and source regions 224A, 224B, depending on the characteristics of the substrate diode still to be formed.

Figure 2G:
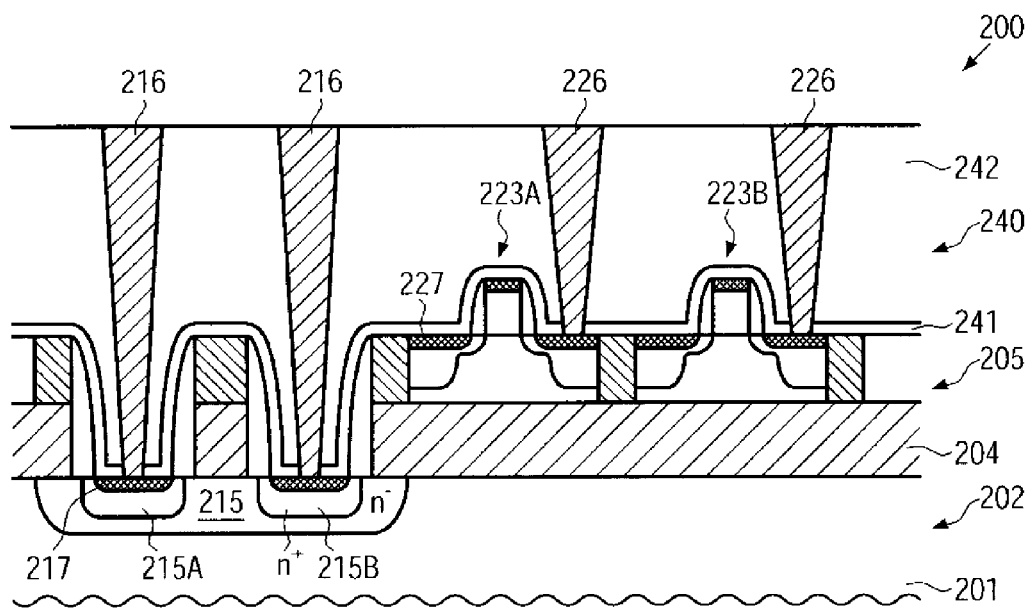

FIG. 2g schematically illustrates the semiconductor device 200 in a further advanced manufacturing stage. As shown, the device 200 may comprise a substrate diode 215 comprised of the well region 211, the highly doped region 215B, which may represent the actual PN junction, and the highly doped region 215A, which may represent a contact area for connecting to the highly doped region 215B via the well region 211. It should be appreciated that the configuration of the substrate diode 215 may be different with respect to the position and the type of dopants of the regions 215A, 215B in other illustrative embodiments, depending on the required conductivity type of the well region 211. Furthermore, metal silicide regions 217 may be formed on top of the highly doped regions 215A, 215B, wherein similar metal silicide regions 227 may be formed in the drain and source regions of the transistors 223A and in the gate electrode structures 222. Furthermore, the semiconductor device 200 may comprise an interlayer dielectric material 240, which may comprise an etch stop layer 241, for instance comprised of silicon nitride and the like, followed by a dielectric material 242 providing desired characteristics to passivate the substrate diode 215 and the circuit elements formed in and above the active layer 205. For example, silicon dioxide may frequently be used as the dielectric material 242.

It should be appreciated that, in sophisticated applications, the interlayer dielectric material 240, that is, at least portions thereof such as the etch stop layer 241, may be provided in the form of a highly stressed dielectric material in order to enhance performance of the transistors 223A, 223B, since the internal stress level may be efficiently transferred into respective channel regions of the transistors, thereby creating a specific type of strain, which may enhance the charge carrier mobility therein. In this case, the etch stop layer 241 may be selectively provided so as to individually enhance the performance of the transistors 223A, 223B, wherein typically one type of etch stop material may be provided for the substrate diode 215, which may be considered appropriate for a reliable operation of the diode 215. Moreover, respective contacts 226 may be formed within the interlayer dielectric material 240 so as to connect to respective contact areas of the transistor 223A, 223B. Similarly, contacts 216 may be formed in the first device region 210 in order to connect the substrate diode 215 with a metallization structure to be formed above the interlayer dielectric material 240.

The semiconductor device 200 as illustrated in FIG. 2g may be formed on the basis of well-established process techniques, which may include the formation of the metal silicide regions 217, 227, which may be accomplished during a common manufacturing sequence. It should be appreciated, however, that additional process steps may be included, for instance, when a process for forming specific components in the substrate diode 215 may not be compatible with the desired diode characteristics. That is, if respective lateral dimensions of, for instance, sidewall spacers, the metal silicide regions 217 and the like have to be specifically adapted in the first device region 210 for obtaining enhanced diode characteristics, appropriate manufacturing processes may be performed in the first device region 210, while substantially not affecting the second device region 220. Thereafter, the etch stop layer 241 may be deposited on the basis of well-established recipes wherein, as previously discussed, appropriate masking regimes may be used if different types of etch stop material may have to be provided for the transistors 223A, 223B. Next, the dielectric material 242 may be deposited, for instance, by using established thermally activated chemical vapor deposition (CVD) techniques, for instance on the basis of TEOS, followed by planarization techniques, sophisticated lithography processes and anisotropic etch steps for forming openings connecting to the transistors 223A, 223B and the substrate diode 215. Thereafter, an appropriate conductive material may be filled into the openings, thereby forming the contacts 216, 226.

Consequently, the semiconductor device 200 may be formed on the basis of a high degree of compatibility with conventional strategies, if desired, while nevertheless providing enhanced equipment throughput due to the significantly reduced implantation energy required for defining the well region 211. Furthermore, any sensitivities of the substrate diode 215 with respect to process variations may be reduced while nevertheless preserving or even extending the operation range compared to a conventionally formed substrate diode. Thus, due to the increased accuracy of the substrate diode, temperature measurement data in the substrate 201 may be obtained in a more precise and reliable manner, thereby enhancing efficiency and reliability of the semiconductor device 200 during operation.

Figure 2H:
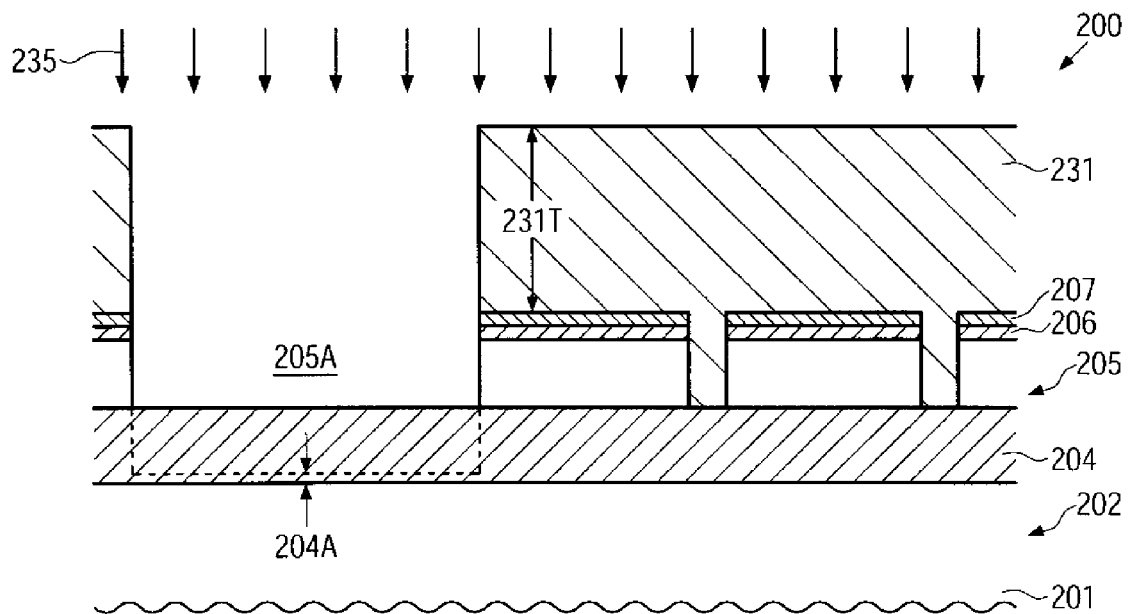
FIGS. 2h-2i schematically illustrates cross-sectional views of the semiconductor device of FIG. 2a, wherein an additional material removal may be performed prior to implanting a well region for a substrate diode according to still further illustrative embodiments.

FIG. 2h schematically illustrates the semiconductor device 200 according to further illustrative embodiments, in which the mask 231, as described in FIG. 2c, may be used as an etch mask during an etch process 235 for further removing material in the first device region 210 to deepen the opening 205A, as is indicated by the dashed lines. In some illustrative embodiments, the etch process 235 may etch through the entire buried insulating layer 204 thereby exposing a portion of the substrate semiconductor layer 202. In other cases, a thickness 204A of the buried insulating layer 204 may be preserved in order to provide a similar implantation condition compared to active regions in the second device region 220, as will be described with reference to FIG. 2i. Thus, in some illustrative embodiments, the etch process 235 may be performed as a timed etch process in order to obtain the desired remaining thickness 204A, while, in other illustrative embodiments, the substrate semiconductor layer 202 may be used as an efficient etch stop material.

Figure 2I:
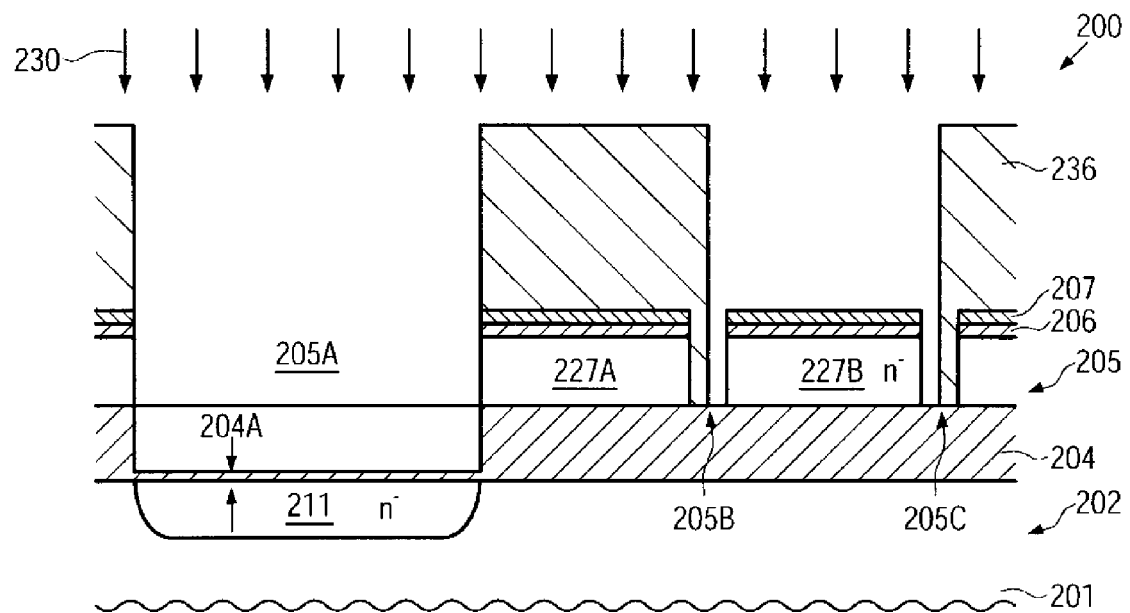

FIG. 2i schematically illustrates the semiconductor device 200 with a further implantation mask 236, which is configured to expose a portion of the second device region 220 corresponding to an active region 227B of the active semiconductor layer 205, while covering an active region 227A. Furthermore, the mask 236 may expose the opening 205A having the increased depth according to the previously performed etch process 235. During the implantation process 230, an appropriate dopant species, such as an N-type species, may be incorporated into the substrate semiconductor layer 202 while also forming a respective well region in the active region 227B. As previously explained, in some illustrative embodiments, the remaining thickness 204A may be selected such that a shielding effect thereof may substantially correspond to the shielding effect of the layers 206 and 207, when substantially the same vertical dopant profile is desired in the active region 227B and the well region 211. In other cases, a higher or a lower value for the thickness 204A may be used, thereby enabling an adjustment of the vertical dopant profile of the well region 211 according to the process parameters as required in the active region 227B. Thereafter, the mask 236 may be removed and the further process may be continued by filling the trench openings 205B, 205C (FIG. 2b), while also filling, at least partially, the opening 205A. In some illustrative embodiments, the opening 205A may be substantially completely filled so as to provide a substantially planar surface configuration during the further processing for completing the semiconductor device 200.

Thus, also in this case, an implantation process may be used on the basis of more uniform process conditions, while also providing enhanced implantation throughput.

Figure 3A:
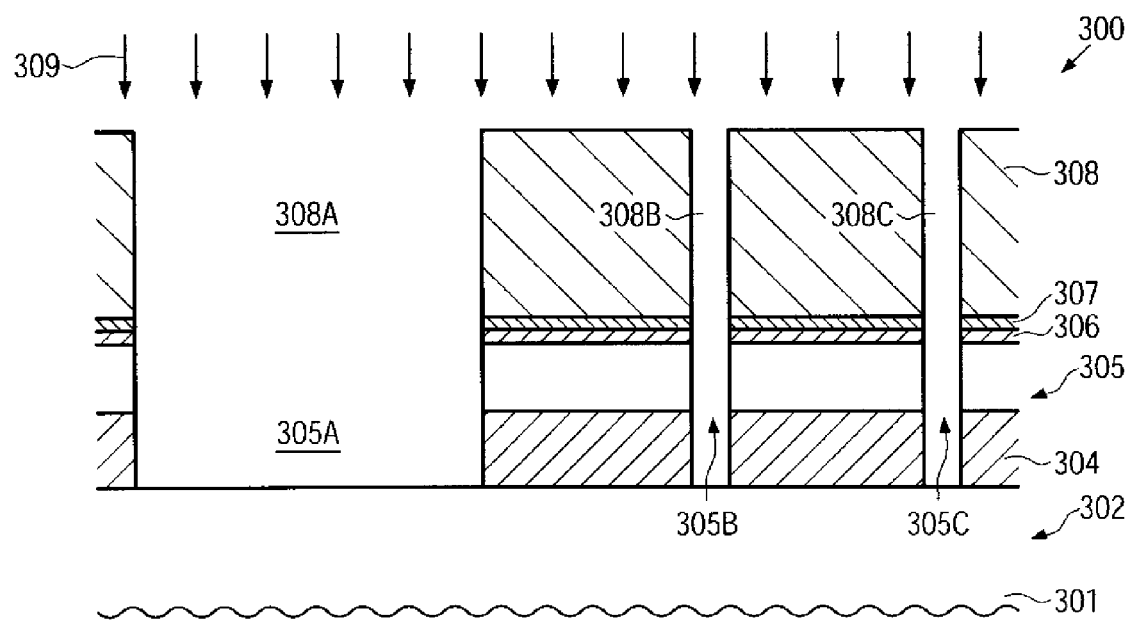
FIGS. 3a-3b schematically illustrate cross-sectional views of a semiconductor device during various manufacturing stages, in which an opening for a substrate implantation and trench openings are formed in a common etch sequence, thereby exposing the substrate material, according to still further illustrative embodiments.
Figure 3B:
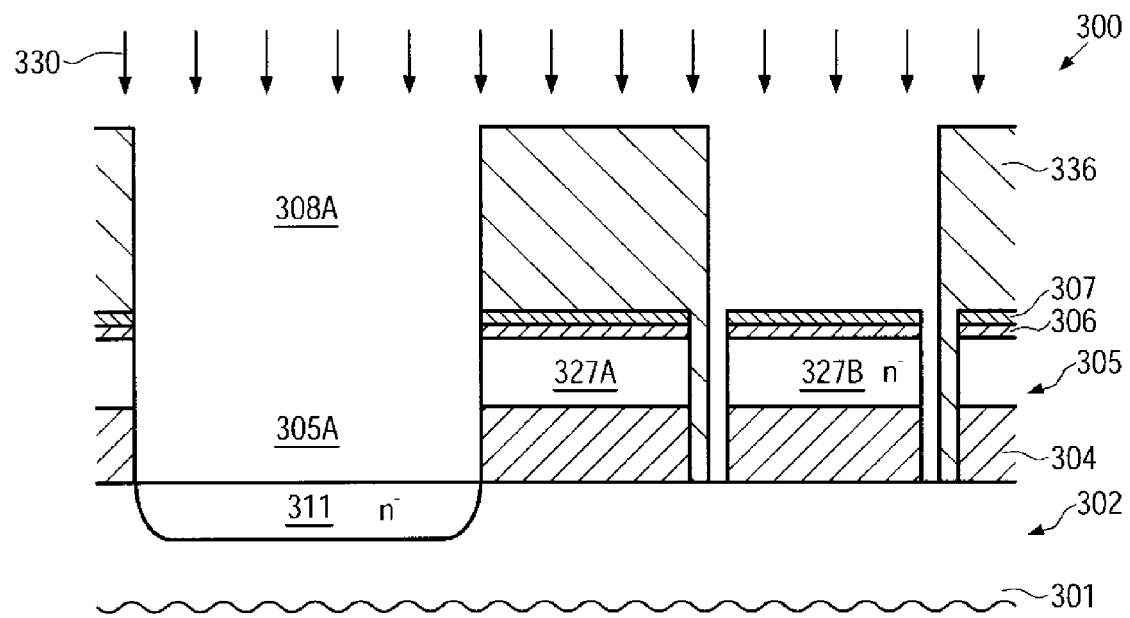

With reference to FIGS. 3a-3b, further illustrative embodiments will now be described in which an opening for implanting a well region for the substrate diode may be formed more deeply in a common etch process for concurrently forming respective trench openings of isolation structures.

FIG. 3a schematically illustrates a semiconductor device 300 comprising a substrate 301, a substrate semiconductor layer 302, a buried insulating layer 304 and an active semiconductor layer 305. With respect to these components, the same criteria apply as previously explained with reference to the devices 100 and 200. Furthermore, the semiconductor device 300 comprises a sacrificial layer stack or hard mask layer stack 306, for instance, comprised of a silicon dioxide layer, and a silicon nitride layer 307. Furthermore, an etch mask 308 may be provided, having respective openings 308A, 308B and 308C for defining respective openings during an etch process 309. During the process 309, an etch chemistry may be used for etching through the active semiconductor layer 305 and also etching into the buried insulating layer 304. For this purpose, an appropriate etch chemistry may be selected, wherein, during etching through the buried insulating layer 304, a timed etch process step may be used if a portion of the buried insulating layer 304 is to be maintained (not shown). In other illustrative embodiments, the process 309 etches substantially completely through the buried insulating layer 304, thereby forming respective substrate openings 305A, 305B and 305C.

FIG. 3b schematically illustrates the semiconductor device 300 in a further advanced manufacturing stage in which an implantation mask 336 is provided that exposes an active region 327B, that is, a respective portion of the layer 307, to an implantation process 330, while covering an active region 327A. Similarly, the mask 336 also exposes the opening 305A in order to form a well region 311 in the substrate semiconductor layer 302, while also defining a well region in the active region 327B. The implantation process may be performed on the basis of moderately low implantation energies, thereby enhancing uniformity and throughput, as previously discussed.

Thereafter, the further processing may be continued by filling the openings 305A, 305B and 305C with dielectric material so as to form trench isolation structures and thereafter the further processing may be continued, as previously described with reference to the device 200.

As a result, the subject matter disclosed herein provides enhanced manufacturing techniques for forming a substrate diode having superior diode characteristics by reducing implantation-induced variation by removing material prior to introducing a dopant species for defining a well region for the substrate diode. The material removal may be performed prior to the formation of isolation trenches when a high degree of decoupling of the manufacturing processes is desired. In other illustrative embodiments, the material removal may be performed concurrently with the formation of respective trench openings of isolation structures, thereby obtaining a highly efficient manufacturing sequence while also maintaining a high degree of compatibility with conventional strategies. In this case, except for forming respective substrate openings for the substrate diode, well-established techniques may be used, if desired. In other illustrative cases, the material removal prior to the implantation process may result in a removal of the buried insulating layer, at least partially, thereby further relaxing any constraints with respect to the implantation parameters. In still other illustrative embodiments, the formation of a well region in the active semiconductor layer may be combined with the definition of a well region for the substrate diode by appropriately adapting the remaining layer thickness of the buried insulating layer above the substrate diode or by completely removing the buried insulating layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first opening in a first device region and a plurality of trench openings in a second device region of an active semiconductor layer formed above a buried insulating layer and a substrate semiconductor layer of an SOI substrate, said first opening and trench openings extending to said buried insulating layer;
    masking said second device region;
    removing a first portion of said buried insulating layer exposed by said first opening without exposing said substrate semiconductor layer, wherein a second portion of said buried insulating layer remains above said substrate semiconductor layer and is exposed by said first opening;
    selectively implanting a dopant species into said substrate semiconductor layer by introducing a single-ionized dopant species through said first opening and through said second portion of said buried insulating layer exposed by said first opening;
    filling said first opening and said plurality of trench openings so as to form trench isolation structures in said second device region after selectively implanting said dopant species;
    forming gate electrode structures in said second device region;
    exposing a first portion and a second portion of said substrate semiconductor layer in said first device region; and
    forming drain and source regions in said active semiconductor layer and a diode structure in said exposed first and second portions of said substrate semiconductor layer.

2. The method of claim 1, wherein exposing said first and second portions of said substrate semiconductor layer comprises forming a mask to cover said second device region and expose a first area and a second area of said first device region, said first and second areas corresponding to said first and second portions of said substrate semiconductor layer, wherein said method further comprises etching a first substrate opening and a second substrate opening corresponding to said first and second portions, respectively.

3. The method of claim 1, wherein forming said drain and source regions comprises performing a first implantation process to form N-type regions in a first transistor and said first portion of the substrate semiconductor layer, and performing a second implantation process to form P-type regions in a second transistor and said second portion of the substrate semiconductor layer.

4. The method of claim 1, further comprising masking said second device region so as to expose at least one transistor area and introducing said dopant species into said at least one transistor area and said substrate semiconductor layer in a common implantation process.

5. The method of claim 4, wherein said exposed part of said buried insulating layer is removed to a thickness corresponding to a shielding effect of a cap layer formed on said at least one transistor area.

6. The method of claim 1, further comprising forming contacts to said drain and source regions and said diode structure by a common process sequence.

7. A method, comprising:
    forming a substrate opening in a first device region of an active semiconductor layer formed on an SOI substrate and a plurality of trench openings in a second device region of said active semiconductor layer, at least said substrate opening in said first device region substantially extending to, but not exposing, a substrate semiconductor layer of said SOI substrate disposed below said active semiconductor layer, wherein a buried insulation layer is disposed between said active semiconductor layer and said substrate semiconductor layer;
    implanting a dopant species through said substrate opening and into said substrate semiconductor layer;
    filling said substrate opening and said trench openings after implanting said dopant species; and
    forming a plurality of transistors in said second device region and a substrate diode in said first device region, wherein implanting said species into said substrate semiconductor layer also comprises implanting, in a common implanting step, said species into a first active region of a first transistor in said second device region while masking a second active region of a second transistor.

8. The method of claim 7, wherein forming said substrate opening and said trench openings comprises etching through said active semiconductor layer and said buried insulating layer in a common etch process.

9. The method of claim 7, wherein forming said substrate opening and said trench openings comprises etching through said active semiconductor layer in a common etch process, masking said second device region and etching through said buried insulating layer in said first device region.

10. The method of claim 7, further comprising forming gate electrode structures for said transistors and forming a first substrate opening and a second substrate opening, said first and second substrate openings each exposing a doped region comprising said dopant species defining a well region of said substrate diode.

11. The method of claim 10, further comprising forming an N-type region through said first substrate opening and N-type drain and source regions in a first transistor in a common process sequence.

12. The method of claim 11, further comprising forming a P-type region through said second substrate opening and P-type drain and source regions in a second transistor in a common process sequence.

13. The method of claim 7, further comprising forming contacts to said substrate diode and drain and source regions of said transistors in a common manufacturing sequence.

* * * * *